(12) United States Patent
Sasmal et al.

(10) Patent No.: US 11,984,184 B2
(45) Date of Patent: May 14, 2024

(54) VOLTAGE TESTING CIRCUIT WITH ERROR PROTECTION SCHEME

(71) Applicant: Micron Technology, Inc., Boise, ID (US)

(72) Inventors: Subhasis Sasmal, Hyderabad (IN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 17/873,869

(22) Filed: Jul. 26, 2022

(65) Prior Publication Data
US 2024/0038321 A1    Feb. 1, 2024

(51) Int. Cl.
*G11C 29/50*    (2006.01)
*G01R 19/165*    (2006.01)
*G11C 29/12*    (2006.01)

(52) U.S. Cl.
CPC .. *G11C 29/50004* (2013.01); *G01R 19/16528* (2013.01); *G01R 19/16533* (2013.01); *G11C 29/12005* (2013.01); *G11C 2029/5004* (2013.01)

(58) Field of Classification Search
CPC .................. G11C 29/50004; G11C 29/50
USPC .................................................. 365/201
See application file for complete search history.

(56) References Cited

U.S. PATENT DOCUMENTS

| | | | | |
|---|---|---|---|---|
| 8,013,579 B2 * | 9/2011 | Tanzawa | ............. | G11C 5/145 327/540 |
| 2013/0148405 A1 * | 6/2013 | Kang | .............. | G11C 29/08 365/158 |
| 2014/0088947 A1 * | 3/2014 | Anemikos | .......... | G01R 31/3004 702/120 |
| 2017/0262004 A1 * | 9/2017 | Petrovic | ............. | G05F 1/465 |

* cited by examiner

*Primary Examiner* — Muna A Techane
(74) *Attorney, Agent, or Firm* — Fletcher Yoder, P.C.

(57) ABSTRACT

An electronic device, such as a memory device, may include various circuit components. The electronic device may also include one or more voltage testing circuits to determine whether signals of one or more of the circuit components are within acceptable voltage ranges of the respective circuit components. Systems and methods are described to improve correct voltage measurement of the received signals by a voltage testing circuit. In particular, multiple supply voltage levels are provided to different components of the voltage testing circuit to provide a sufficient headroom voltage gap between received signals and the supply voltages. For example, some active circuits (e.g., operational amplifiers) of the voltage testing circuit may receive a higher supply voltage of the electronic device compared to one or more other circuits of the voltage testing circuit.

20 Claims, 2 Drawing Sheets

VOLTAGE TESTING CIRCUIT WITH ERROR PROTECTION SCHEME

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to electronic devices and more specifically to voltage testing circuits used in various electronic devices. An electronic device may include a memory device, a processing device, and routing circuitry, among other things. For example, the memory device may include a number of memory arrays including memory cells, a row decoder, and a column decoder, among other memory components, to perform memory operations including memory read and write operations. Moreover, various circuit components of the electronic device, including the memory components, may provide one or more signals for performing the memory operations.

The electronic device may also include one or more testing circuits, such as a voltage testing circuit, to monitor operations of some of the circuit components. The voltage testing circuit may receive one or more signals of one or more of the circuit components and determine whether a voltage level of the signals is within an acceptable voltage range of the respective circuit components. Accordingly, the voltage testing circuit may provide an indication of whether the voltage levels of the received signals are outside the acceptable voltage ranges of the respective circuit components. In specific cases, a controller may determine erroneous behavior and/or operations of one or more of the circuit components based on receiving an indication from the voltage testing circuit indicative of a voltage level of one or more of the circuit components being out of respective acceptable voltage ranges.

BRIEF DESCRIPTION OF THE DRAWINGS

Various aspects of this disclosure may be better understood upon reading the following detailed description and upon reference to the drawings in which.

DETAILED DESCRIPTION

Figure 1:
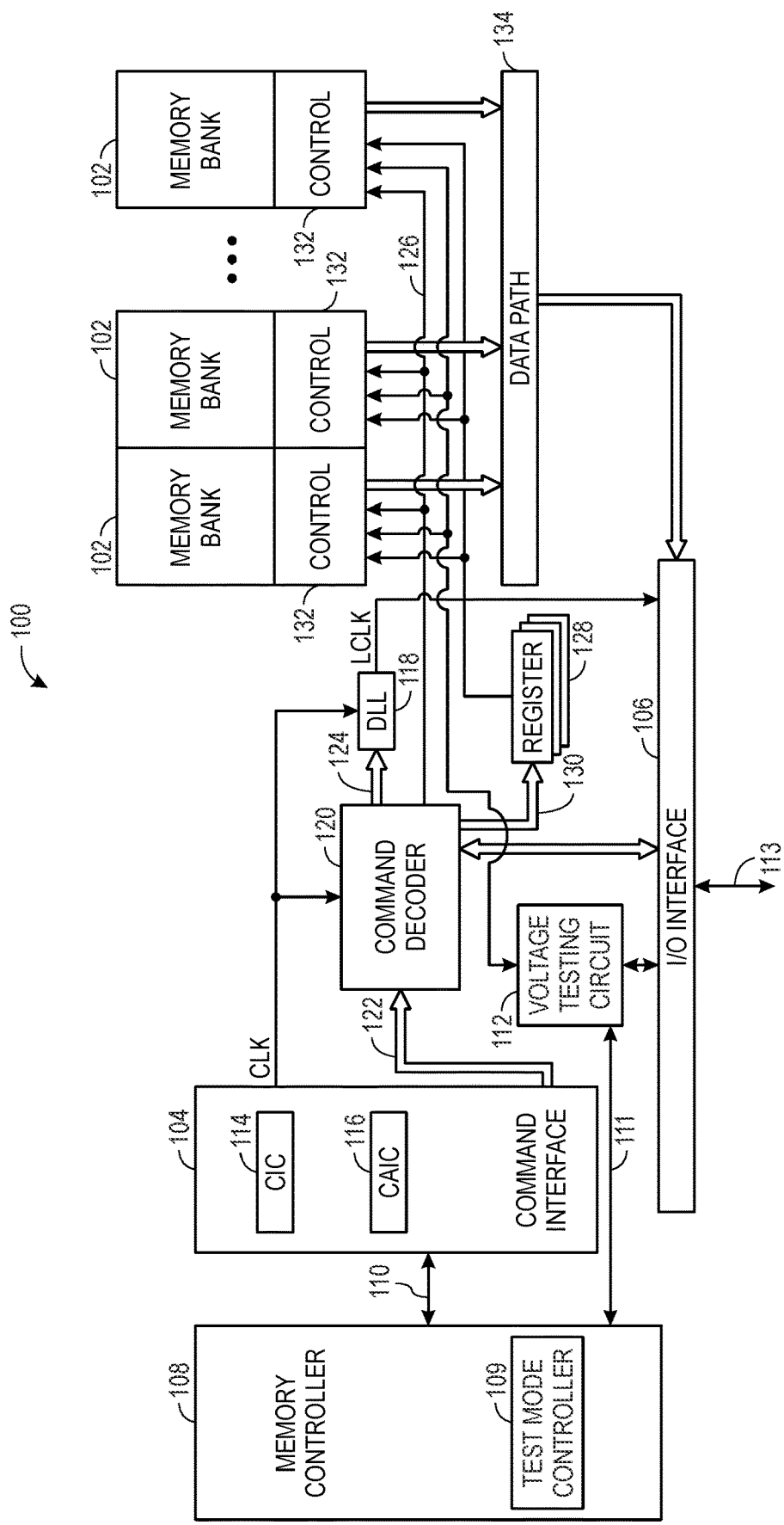
FIG. 1 is a block diagram illustrating certain features of a memory device, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An electronic device may include multiple circuit components including one or more voltage testing circuits. For example, a voltage testing circuit may receive multiple test signals from various circuit components of the electronic device. The voltage testing circuit may include circuitry to measure a voltage level of a received test signal from a circuit component. Moreover, the voltage testing circuit may determine whether the voltage level of the test signal is within a respective acceptable voltage range of the circuit component. For example, the voltage testing circuit may refer to a lookup table to determine the acceptable voltage range of the circuit component. In some cases, the voltage testing circuit may provide an indication indicative of whether the voltage level of the test signal is within the acceptable voltage range of the circuit component.

The voltage testing circuit may include various circuitry to receive the test signal, condition the received test signal, and measure and/or provide the conditioned test signal to other circuit components. For example, the voltage testing circuit may include conditioning circuitry to receive the test signals and provide the conditioned test signals to an input of an amplifier (e.g., a unit gain buffer). If not accounted for, in some cases, receiving the conditioned test signals by the amplifier having voltage levels equal to or substantially equal to a supply voltage of the amplifier (e.g., outside a linear input voltage range of the amplifiers) may cause erroneous operations of the amplifier and therefore the voltage testing circuit. For example, the supply voltage of the amplifier may have a first voltage level.

In such cases, for normal operation, the conditioning circuitry may provide the conditioned test signals to the amplifier with a voltage level equal to or below a threshold. The conditioned test signals having the voltage level equal to or below the threshold may provide a headroom voltage gap between the voltage levels of the received signals and the first voltage level associated with the supply voltage of the amplifier. Accordingly, the supply voltage of the amplifier may have a voltage level higher than the voltage level of the conditioned test signals higher by at least a voltage value of the headroom voltage gap.

The voltage testing circuit may also include an input/output driver. The amplifier may provide output test signals to the input/output driver that may provide the one or more output test signals to other circuit components. In some cases, the first voltage level associated with the supply voltage of the amplifier may be higher a second voltage level associated with a supply voltage of the input/output driver. Accordingly, if not accounted for, in some cases, the input/output driver may receive the output test signals from the amplifier with a voltage level equal to or close to the second voltage level associated with the supply voltage of the input/output driver. In such cases, the input/output driver may operate erroneously based on violation of a headroom voltage gap between the voltage levels of the output test signals of the amplifier and the second voltage level associated with the supply voltage of the input/output driver. For example, in such cases, the input/output driver may latch a high or low signal, among other possible erroneous behavior.

In some embodiments, the voltage testing circuit may include a comparator that may only allow providing the output test signals of the amplifier to the input/output driver with a voltage level equal to or below the second voltage level associated with the supply voltage of the input/output driver. For example, a first input of the comparator may receive a supply voltage with the second voltage level as a reference voltage and a second input of the comparator may receive the output test signals of the amplifier. Accordingly, the comparator may provide an output signal to allow or prevent providing the output test signals of the amplifier when a voltage level of the output test signals is above the second voltage level (associated with the supply voltage of the input/output driver). In specific cases, the threshold (discussed above) may be selected to be equal to (or substantially equal to) the second voltage level associated with the supply voltage of the input/output driver.

In some cases, the amplifier may include a unit gain buffer to provide the output test signals to the input/output driver with the same voltage level (or substantially same voltage level) of the conditioned signals that is equal to or below the threshold. Accordingly, the comparator may allow providing such output test signals having the headroom voltage gap between the conditioned signals and the supply voltage of the input/output driver.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

The memory device 100 may include a number of memory banks 102 each inclusive of one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle.

The memory device 100 may also include a command interface 104 and an input/output (I/O) interface 106. The command interface 104 is configured to provide a number of signals received from a processor (e.g., a processor subsystem of an apparatus) or a controller, such as a memory controller 108 or a test mode controller 109. In different embodiments, the memory controller 108 and the test mode controller 109 may include one or more processors (e.g., memory processors), one or more programmable logic fabrics, or any other suitable processing components. Moreover, although in the depicted embodiment the memory controller 108 includes the test mode controller 109, in alternative or additional embodiments, the test mode controller 109 may be disposed at any other viable location. For example, the test mode controller 109 may be a standalone controller including any viable circuitry.

In some embodiments, a bus 110 may provide a signal path or a group of signal paths to allow bidirectional communication between the memory controller 108, the command interface 104 and the I/O interface 106. For example, the memory controller 108 may receive memory access requests from the I/O interface via the command interface 104 and the bus 110. Moreover, the memory controller 108 may provide the access commands and/or access instructions for performing memory operations to the command interface 104 via the bus 110.

Similarly, a bus 111 may provide a signal path or a group of signal paths to allow bidirectional communication between the test mode controller 109 (and/or the memory controller 108) and a voltage testing circuit 112. Moreover, an external bus 113 may provide another signal path or group of signal paths to allow for bidirectional transmission of signals, such as data signals and access commands (e.g., read/write requests), between the I/O interface 106, the memory controller 108, a command decoder 120, and/or other components. Thus, the memory controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the memory controller 108. For example, a reset command may be used to reset the command interface 104, status registers, state machines and the like, during power-up. Various testing signals may also be provided to the memory device 100. For example, the memory controller 108 may use such testing signals to test connectivity of different components of the memory device 100. In some embodiments, the command interface 104 may also provide an alert signal to the memory controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 113.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 113. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory cells of the respective memory banks 102. For example, the control blocks 132 may include circuitry (e.g., logic circuitry) to facilitate accessing the memory cells of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102. In specific cases, the control blocks 132 may also provide one or more test signals to the voltage testing circuit 112. For example, the voltage testing circuit 112 may provide an indication of normal or erroneous voltage level of one or more of the control blocks 132 based on receiving the test signals of the control blocks 132, as will be appreciated.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various semiconductor devices to provide and/or define operations of various components of the memory device 100.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the semiconductor device (e.g., die), such that the registers are communicatively coupled to the corresponding memory components.

The voltage testing circuit 112 may include circuitry to receive the test signals from various circuit components of the memory device 100 described above to provide indications of normal or erroneous voltage levels of the test signals. In different cases, the control blocks 132, the memory controller 108, and/or the command interface 104, among other circuit components, may provide the test signals to the voltage testing circuit 112. In some cases, the memory controller 108 and/or the test mode controller 109, among other viable controllers not shown in FIG. 1, may determine normal or erroneous operations of the circuit components based on receiving such indications. In specific cases, the voltage testing circuit 112 may operate during a test mode of the electronic device. For example, the voltage testing circuit 112 may perform operations of the test mode based on receiving one or more triggering signals (e.g., from the memory controller) and/or during a power-up sequence of the memory device 100 (e.g., before normal operations of the memory device 100).

In particular, the voltage testing circuit 112 may determine whether a voltage level of a test signal received from a circuit component is within an acceptable voltage range of the circuit component. For example, the voltage testing circuit 112 may refer to a lookup table stored therein, stored in the memory controller 108, stored in the test mode controller 109, or stored in any other viable circuit, to determine the acceptable voltage range of the circuit component. Some embodiments of the voltage testing circuit 112 are described below with respect to FIG. 2, as will be appreciated.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over the data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external supply voltages, such as VDD and VSS signals), read/write amplifiers (to amplify signals during read/write operations), temperature sensors (for sensing temperatures of the memory device 100), etc. Moreover, the memory device 100 may include circuitry to generate multiple internal supply voltages based on receiving one or more external supply voltages. Accordingly, it should be understood that the block diagram of FIG. 1 is only provided to highlight certain functional features of the memory device 100 to aid in the subsequent detailed description.

Figure 2:
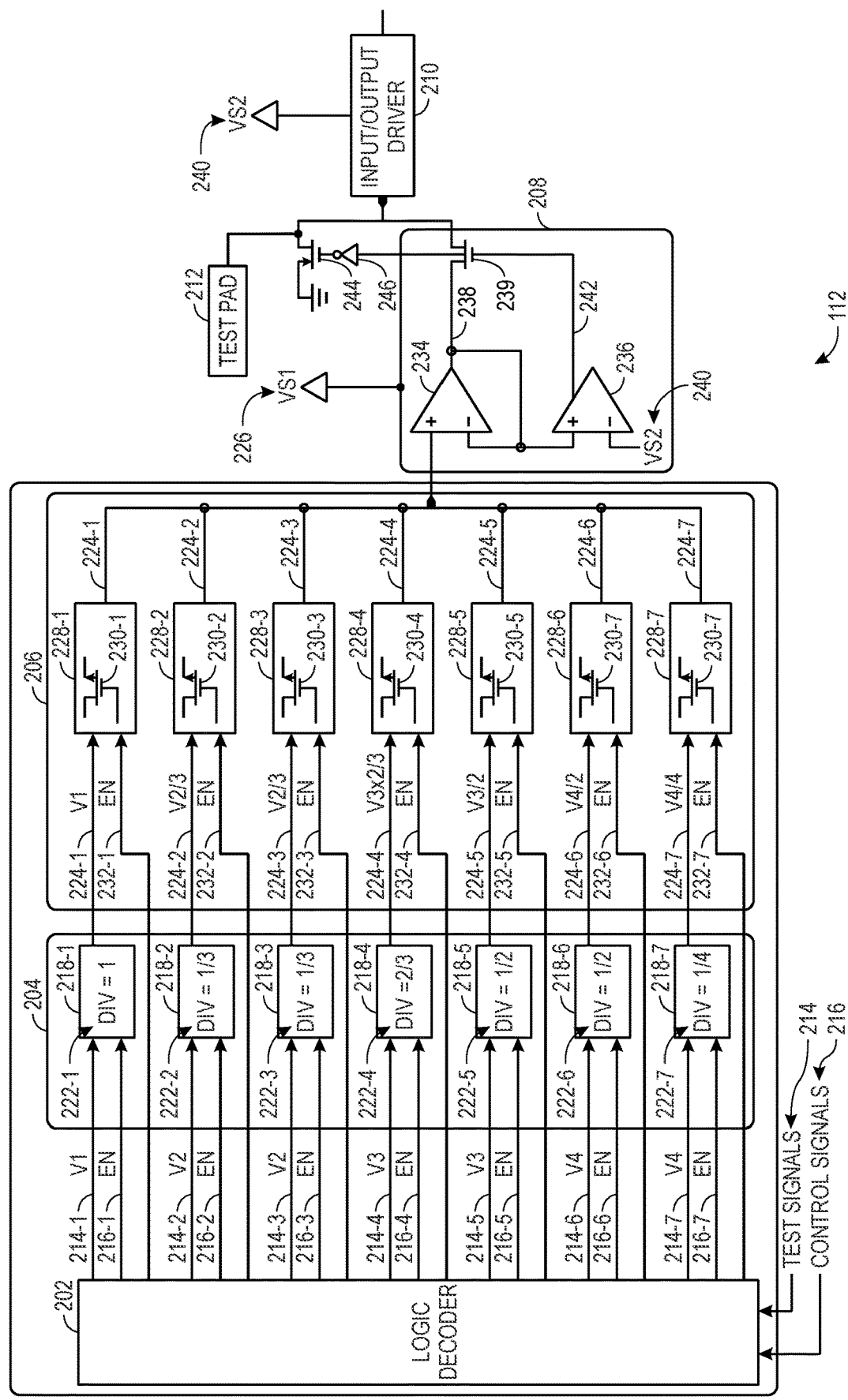
FIG. 2 is a schematic of a voltage testing circuit shown in the memory device of FIG. 1, in accordance with an embodiment of the present disclosure.

FIG. 2 depicts a schematic of the voltage testing circuit 112. As mentioned above, and described with respect to various embodiments of the voltage testing circuit 112 described herein, the memory device 100 of FIG. 1 may include the voltage testing circuit 112. However, it should be appreciated that in other embodiments, any other viable electronic device may also include the voltage testing circuit 112. In any case, the voltage testing circuit 112 may determine whether a voltage level of one or more circuit blocks is within acceptable voltage level ranges associated with the one or more circuit blocks. In the depicted embodiment, the voltage testing circuit 112 may determine whether a voltage level of a received signal from one or more of the control blocks 132, the memory controller 108, and/or the command interface 104, among other circuit components, is within the respective acceptable voltage level ranges.

The voltage testing circuit 112 includes a conditioning circuit 200 including a logic decoder 202, a divider circuit 204, and a switching circuit 206. Moreover, the voltage testing circuit 112 may include an amplification circuit 208, an input/output driver 210, and a test pad 212. In alternative or additional cases, the input/output driver 210, the test pad 212, or both may be omitted or disposed remotely from the voltage testing circuit 112.

In any case, the logic decoder 202 may receive a number of test signals 214 from various circuit blocks of the memory device 100. For example, the logic decoder 202 may receive the test signals 214 from one or more of the control blocks 132, the memory controller 108, and/or the command interface 104, among other circuit blocks. Moreover, the logic decoder 202 may include various circuit components, such as logic elements, to receive the test signals 214 and provide the test signals 214 to the divider circuit 204.

In some embodiments, the logic decoder 202 may also receive one or more control signals 216 from the memory controller 108 or the test mode controller 109. The control signals 216 may indicate testing one or more of the test signals 214, an order of testing the test signals 214, or both. As such, the logic decoder 202 may provide the test signals 214 (e.g., 214-1, 214-2, 214-3, 214-4, 214-5, 214-6, and 214-7) that are selected to the divider circuit 204 based on receiving the control signals 216. In the depicted embodiment, the logic decoder 202 may select between the test signals 214 by providing enable signals 216 (e.g., 216-1, 216-2, 216-3, 216-4, 216-5, 216-6, and 216-7) associated with the test signals 214 that are selected.

The divider circuit 204 may include a number of dividers 218 (e.g., 218-1, 218-2, 218-3, 218-4, 218-5, 218-6, and 218-7) coupled to the logic decoder 202 and the switching circuit 206. Each of the dividers 218 may receive one of the test signals 214 and a respective enable signal 216. Each divider 218 may divide a voltage level of the respective test signal 214 based on a respective division ratio 222 (e.g., 222-1, 222-2, 222-3, 222-4, 222-5, 222-6, and 222-7) in response to receiving a high (or low) enable signal 216 indicative of providing a divided test signal 224 (e.g., 224-1, 224-2, 224-3, 224-4, 224-5, 224-6, and 224-7) (e.g., or the conditioned signals mentioned above). Accordingly, each divider 218 may provide a divided test signal 224 of the selected test signal 214 in response to receiving the indication (e.g., the high or low enable signal 216).

The dividers 218 may each include circuitry for dividing the voltage level of the received test signal 214 based on the respective division ratio 22. For example, in the depicted embodiment, the divider 218-2 may include circuitry to divide a voltage level of the test signal 214-2 based on a division ratio 222-2 (e.g., ⅓) in response to receiving the enable signal 216-2 indicative of providing the divided test signal 224-2. Accordingly, the divider 218-2 may provide the divided test signal 224-2 to the switching circuit 206.

The division ratios 222 associated with each of the dividers 218 are provided based on an expected voltage level of the respective test signals 214 and a voltage level of a first supply voltage 226 (VS1) of the amplification circuit 208. In the depicted embodiment, the divider circuit 204 may provide the divided test signals 224 to the amplification circuit 208 through the switching circuit 206. In some cases, the amplification circuit 208 may become saturated, provide non-linear output signals, or otherwise malfunction when receiving the divided test signals 224 with a voltage level higher than the high voltage threshold. Accordingly, a high voltage threshold (e.g., maximum voltage) for receiving the divided test signals 224 is determined to be below the first supply voltage 226 provided to the amplification circuit 208.

In particular, the high voltage threshold may be determined to be below the supply voltage of the amplification circuit 208 such that there is at least a headroom voltage gap between the high voltage threshold and the first supply voltage 226 of the amplification circuit 208. As such, the division ratios 222 are provided (e.g., determined) such that the divider circuit 204 may provide each of the divided test signals 224 with a voltage level equal to or below the high voltage threshold. Accordingly, the divided test signals 224 may provide the headroom voltage gap between the divided test signals 224 and the first supply voltage 226.

Moreover, and as mentioned above, the memory device 100 may generate multiple internal supply voltages based on receiving one or more external supply voltages. As such, in some cases, the memory device 100 may generate the first supply voltage 226 based on receiving the one or more external supply voltages. In alternative or additional cases, the one or more external supply voltages may provide the first supply voltage 226.

The switching circuit 206 may include a number of switches 228 (e.g., 228-1, 228-2, 228-3, 228-4, 228-5, 228-6, and 228-7) each coupled to a respective divider 218, the logic decoder 202, and the amplification circuit 208. The switching circuit 206 may provide the divided test signals 224 from the divider circuit 204 to the amplification circuit 208. For example, in different embodiments, the switches 228 may include various type of transistors such as metal-oxide-semiconductor field-effect transistors (MOSFETs) and/or Bipolar Junction Transistors (BJTs), among other things. In the depicted embodiment, a gate 230 (e.g., 230-1, 230-2, 230-3, 230-4, 230-5, 230-6, and 230-7) of each of the switches 228 is coupled to the logic decoder 202 to receive a respective enable signal 232 (e.g., 232-1, 232-2, 232-3, 232-4, 232-5, 232-6, and 232-7). In different embodiments, the enable signals 232 may be similar or different from the enable signals 216. Moreover, an input of each of the switches 228 is coupled to a respective divider 218 to receive a respective divided test signal 224.

Furthermore, an output of each of the switches 228 is coupled to the amplification circuit 208. Each of the switches 228 may short a conductive path between the respective divider 218 and the amplification circuit 208 in response to receiving the respective enable signal 232 via the respective gates 230. Accordingly, each of the switches 228 may provide the divided test signals 224 to the amplification circuit 208 based on receiving the respective enable signals 232. For example, the logic decoder 202 may provide each of the enable signals 232 with or subsequent to providing a respective enable signal 216 to cause provision of a respective divided test signal 224 to the amplification circuit 208.

The amplification circuit 208 may include an amplifier 234, a comparator 236, and a first switch 239. The amplifier 234 may receive the divided test signals 224 via a noninverting input and receive a feedback from an output of the amplifier 234 via an inverting input. The amplifier 234 may include a buffer circuit to provide the received divided test signals 224 with a unit gain to the output of the amplifier 234. As such, the amplifier 234 may provide output test signals 238 with a voltage level of the divided test signals 224 that are equal to or below the high voltage threshold.

As mentioned above, the amplification circuit 208 may receive the first supply voltage 226. In particular, the amplifier 234 and the comparator 236 may receive the first supply voltage 226 as the supply power. Moreover, the conditioning circuit 200 may provide the divided test signals 224 with a voltage level equal to or below the high voltage threshold. Accordingly, there is at least a headroom voltage gap between the divided test signals 224 and the output test signals 238 with the first supply voltage 226 provided to the amplification circuit 208.

Moreover, the amplifier 234 may provide the output test signals 238 to the inverting input of the amplifier 234 (as a feedback signal), an input of the first switch 239, a noninverting input of the comparator 236, and a test pad 212. As mentioned above, the comparator 236 may receive the output test signals 238 at the noninverting input of the comparator 236. Moreover, the comparator 236 may receive a second supply voltage 240 at an inverting input of the comparator 236. As such, the comparator 236 may provide a high output signal 242 from an output of the comparator 236 when a voltage level of the output test signals 238 are below a voltage level of the second supply voltage 240.

In some embodiments, the second supply voltage 240 is equal to or substantially equal to the high voltage threshold discussed above. As mentioned above, the high voltage threshold is below a voltage level of the first supply voltage 226 by, at least, a voltage value of a headroom voltage gap (e.g., 0.2 volt (V), 0.25 V, 0.3 V, 0.35 V, and so on). For example, the headroom voltage gap may prevent saturation of the amplifier 234 and/or the comparator 236. Accordingly, the comparator 236 may provide the high output signal 242 when the headroom voltage gap is present between the output test signals 238 and the first supply voltage 226.

Similar to the first supply voltage 226, the memory device 100 may generate and provide the second supply voltage 240, as an internal supply voltage, to the comparator 236. Moreover, in alternative or additional cases, the one or more external supply voltages may provide the second supply voltage 240. In one non-limiting example, the first supply voltage may be equal to (substantially equal to) 1.8 V and the second supply voltage 240 (e.g., the high voltage threshold) may be equal to (substantially equal to) 1 V. In any case, the comparator 236 may provide the high output signal 242 when receiving the output test signals 238 with a voltage level below the voltage level of the second supply voltage 240 (e.g., 1 V).

In the depicted embodiment, the comparator 236 may provide the high output signal 242 to a gate of the first switch 239 and a gate of a second switch 244 via an inverter 246. As such, the first switch 239 may close a connection to provide the output test signals 238 from the amplifier 234 to an input of the second switch 244 and an input/output driver 210. Moreover, the second switch 244 may open a connection between ground and the input/output driver 210.

Accordingly, the input/output driver 210 may receive the output test signals 238 from the amplifier 234. At other times, the second switch 244 may close a connection between the ground and the input/output driver 210.

In some cases, the test pad 212 may determine whether the output test signals 238 are within acceptable voltage ranges of the respective circuit components when the first switch 239 (e.g., and/or the second switch 244) is closed. In specific cases, the test pad 212 may provide an indication of whether a voltage level of an output test signal 238 associated with a test signal 214 is within or outside a respective acceptable voltage range to the memory controller 108, the test mode controller 109, or other viable circuitry. In different embodiments, the test pad 212 may be positioned in the voltage testing circuit 112 or any other viable position.

The input/output driver 210 may drive input/output connections (e.g., pins) of the memory device 100. For example, the input/output driver 210 may provide high voltages to the I/O interface 106 described above with respect to FIG. 1 to drive the external bus 113 and provide signals to other circuits. For example, the input/output driver 210 may provide alert signals to other system components electrically connected to the memory device 100. It should be appreciated that the input/output driver 210 is provided by the way of example, and in other embodiments, additional or alternative circuits may receive the output test signals 238 from the amplifier 234.

In any case, in the depicted embodiment, the input/output driver 210 may also receive the second supply voltage 240 as the supply power. As discussed above, the comparator 236 may allow provision of the output test signals 238 to the input/output driver 210 with a voltage level equal to or below the voltage level of the second supply voltage 240. Accordingly, the input/output driver 210 may operate with reduced errors (e.g., latching, among other things) based on having, at least, the headroom voltage gap between input signals (e.g., the output test signals 238) and the supply power (e.g., the second supply voltage 240).

With these technical effects in mind, using the different supply voltages (e.g., the first supply voltage 226 and the second supply voltage 240) with the voltage testing circuit 112 may improve erroneous operations and/or behavior of the voltage testing circuit 112. For example, providing the headroom voltage gap between input signals and supply voltages of various circuit components of the voltage testing circuit 112 may reduce errors, non-linear behavior, and therefore erroneous measurements. Moreover, the divider circuit 204 of the voltage testing circuit 112 may use smaller division ratios to provide the divided test signals 224 based on an increased headroom voltage. As such, possible offset voltages cause by different circuit components of the voltage testing circuit 112 may be reduced based on a smaller change in a voltage level of the divided test signals 224. Accordingly, the voltage testing circuit 112 may provide more reliable indications of acceptable (or out of range) voltages of different circuit components of the memory device 100, or any other viable electronic device.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
one or more memory banks;
a memory controller configured to provide instructions to determine whether voltage levels of one or more test signals associated with the one or more memory banks are within acceptable voltage ranges of the one or more memory banks; and
a voltage testing circuit comprising:
a divider circuit configured to:
receive the one or more test signals, wherein the one or more test signals have a voltage level above a high voltage threshold of the divider circuit; and
divide the one or more test signals by one or more division ratios associated with each of the one or more test signals based on the instructions, wherein dividing the one or more test signals comprises determining one or more divided test signals with voltage levels equal to or below the high voltage threshold; and
an amplification circuit comprising an amplifier, wherein the amplifier is configured to:
receive the one or more divided test signals;
receive a first supply voltage higher than the high voltage threshold providing a headroom voltage gap between the high voltage threshold and the first supply voltage; and
provide one or more amplified divided test signals based on receiving the one or more divided test signals to determine whether the voltage level of the one or more test signals are within the acceptable voltage ranges.

2. The memory device of claim 1, wherein the voltage testing circuit comprises a logic decoder configured to receive the one or more test signals and one or more control signals, wherein the logic decoder is configured to provide the one or more test signals to the divider circuit with respective enable signals indicative of providing the one or more divided test signals to the amplification circuit based on the control signals.

3. The memory device of claim 1, wherein the divider circuit comprises one or more dividers each configured to receive one of the one or more test signals and provide a respective amplified divided test signal of the one or more amplified divided test signals.

4. The memory device of claim 1, wherein the voltage testing circuit comprises one or more switches coupled to the divider circuit and the amplification circuit, wherein each of the one or more switches is configured to provide one of the one or more divided test signals to the amplifier upon receiving an enable signal.

5. The memory device of claim 4, wherein the enable signal is indicative of testing a voltage level of the one or more test signals by the voltage testing circuit.

6. The memory device of claim 1, wherein the amplifier comprises a buffer with a unit gain.

7. The memory device of claim 1, wherein the amplification circuit comprises a comparator, wherein the comparator is configured to:
receive the one or more amplified divided test signals at a first input;
receive a reference voltage having a voltage level of the high voltage threshold at a second input; and
output a comparator signal indicative of whether a voltage level of received amplified divided test signal of the one or more amplified divided test signals is equal to or below the high voltage threshold.

8. The memory device of claim 7, wherein the voltage testing circuit comprises an input/output driver, wherein the amplification circuit comprises a switch configured to receive the comparator signal, wherein the switch is configured to provide the received amplified divided test signal of the one or more amplified divided test signals to the input/output driver based on receiving the comparator signal.

9. The memory device of claim 8, wherein the input/output driver is configured to receive a second supply voltage having a voltage of the high voltage threshold.

10. The memory device of claim 1, comprising a test pad configured to determine whether a voltage level of the one or more amplified divided test signals are within respective voltage level ranges of one or more electrical components providing the one or more test signals.

11. The memory device of claim 1, wherein the divider circuit is configured to receive additional test signals from one or more other circuit components of the memory device and determine whether a voltage level of the received test signals are within a respective acceptable voltage level of the one or more other circuit components.

12. An electronic device comprising:
one or more electronic components;
a memory device;
a memory controller configured to provide instructions to determine whether voltage levels of one or more test signals associated with the memory device, the one or more electronic components, or a combination thereof, are within respective acceptable voltage ranges; and
a voltage testing circuit comprising:
a divider circuit configured to:
receive the one or more test signals, wherein the one or more test signals have a voltage level above a high voltage threshold of the voltage testing circuit; and
divide the one or more test signals by one or more division ratios associated with each of the one or more test signals based on the instructions, wherein dividing the one or more test signals comprises determining one or more divided test signals with respective voltage levels equal to or below the high voltage threshold; and
an amplification circuit comprising an amplifier, wherein the amplifier is configured to:
receive the one or more divided test signals;
receive a first supply voltage higher than the high voltage threshold providing a headroom voltage gap between the high voltage threshold and the first supply voltage; and
provide one or more amplified divided test signals based on receiving the one or more divided test signals to determine whether the voltage level of the one or more test signals are within respective acceptable voltage ranges.

13. The electronic device of claim 12, wherein the voltage testing circuit comprises a logic decoder configured to receive the one or more test signals and one or more control signals, wherein the logic decoder is configured to provide the one or more test signals to the divider circuit with respective enable signals indicative of providing the one or more divided test signals to the amplification circuit.

14. The electronic device of claim 12, wherein:
the amplification circuit comprises a comparator, wherein the comparator is configured to:
receive the one or more amplified divided test signals at a first input;
receive a reference voltage having a voltage level of the high voltage threshold at a second input; and
output a comparator signal indicative of whether a received amplified divided test signal of the one or more amplified divided test signals is equal to or below the high voltage threshold;
the amplification circuit comprises a switch configured to receive the comparator signal; and
the voltage testing circuit comprises an input/output driver, wherein the switch is configured to provide the received amplified divided test signal of the one or more amplified divided test signals to the input/output driver based on receiving the comparator signal, wherein the input/output driver is configured to receive a second supply voltage having a voltage of the high voltage threshold.

15. A voltage testing circuit comprising:
a divider circuit configured to:
receive one or more test signals with a voltage level above a high voltage threshold; and
divide the one or more test signals by one or more division ratios associated with each of the one or more test signals to determine one or more divided test signals with respective voltage levels equal to or below the high voltage threshold; and
an amplification circuit comprising an amplifier, wherein the amplifier is configured to:
receive the one or more divided test signals with voltage levels equal to or below the high voltage threshold;
receive a first supply voltage higher than the high voltage threshold providing a headroom voltage gap between the high voltage threshold and the first supply voltage; and
provide one or more amplified divided test signals based on receiving the one or more divided test signals to determine voltage level of the one or more test signals associated with each of the one or more amplified divided test signals.

16. The voltage testing circuit of claim 15, comprising a logic decoder configured to receive the one or more test signals and one or more control signals, wherein the logic decoder is configured to provide the one or more test signals to the divider circuit with respective enable signals indicative of dividing the one or more test signals and providing the one or more divided test signals to the amplification circuit.

17. The voltage testing circuit of claim 15, wherein the divider circuit comprises one or more dividers each configured to receive one of the one or more test signals and provide a respective amplified divided test signal of the one or more amplified divided test signals.

18. The voltage testing circuit of claim 15, wherein the amplifier comprises a buffer with a unit gain.

19. The voltage testing circuit of claim 15, wherein the amplification circuit comprises a comparator, wherein the comparator is configured to:
receive the one or more amplified divided test signals at a first input;
receive a reference voltage having a voltage level of the high voltage threshold at a second input; and
output a comparator signal indicative of whether a received amplified divided test signal of the one or more amplified divided test signals is equal to or below the high voltage threshold.

20. The voltage testing circuit of claim 19, comprising an input/output driver, wherein the amplification circuit comprises a switch configured to receive the comparator signal, wherein the switch is configured to provide the received amplified divided test signal of the one or more amplified divided test signals to the input/output driver based on receiving the comparator signal, wherein the input/output driver is configured to receive a second supply voltage having a voltage of the high voltage threshold.

* * * * *